United States Patent
Saffman

(10) Patent No.: US 11,531,249 B1
(45) Date of Patent: Dec. 20, 2022

(54) CONSTANT-FREQUENCY ACOUSTO-OPTIC BEAM STEERING

(71) Applicant: ColdQuanta, Inc., Boulder, CO (US)

(72) Inventor: Mark Saffman, Madison, WI (US)

(73) Assignee: ColdQuanta, Inc., Boulder, CO (US)

( * ) Notice: Subject to any disclaimer, the term of this patent is extended or adjusted under 35 U.S.C. 154(b) by 0 days.

(21) Appl. No.: 17/727,756

(22) Filed: Apr. 24, 2022

Related U.S. Application Data

(60) Provisional application No. 63/235,017, filed on Aug. 19, 2021.

(51) Int. Cl.
*G02F 1/33* (2006.01)

(52) U.S. Cl.
CPC ............ *G02F 1/33* (2013.01); *G02F 2203/24* (2013.01)

(58) Field of Classification Search
CPC ... G02F 1/33; G02F 1/332; G02F 1/29; G02F 1/31; G02F 1/335
See application file for complete search history.

(56) References Cited

U.S. PATENT DOCUMENTS

| | | | |
|---|---|---|---|
| 6,704,474 B1* | 3/2004 | Dorschner | G02F 1/29 385/20 |
| 11,329,447 B2* | 5/2022 | Maker | H01S 3/10053 |
| 2013/0216183 A1* | 8/2013 | Neilson | G02B 6/29311 385/37 |
| 2017/0038582 A1* | 2/2017 | Chau | B60Q 1/085 |
| 2017/0131617 A1* | 5/2017 | Hua | B23K 26/064 |
| 2019/0331981 A1* | 10/2019 | Ismail | G02F 1/33 |
| 2020/0301241 A1 | 9/2020 | Duan | |
| 2021/0157180 A1 | 5/2021 | Wasilousky | |
| 2022/0137390 A1 | 5/2022 | Kim | |

* cited by examiner

*Primary Examiner* — Christopher Stanford
*Assistant Examiner* — Journey F Sumlar
(74) *Attorney, Agent, or Firm* — Van Pelt, Yi & James LLP; Clifton Anderson

(57) ABSTRACT

A pair of acousto-optic deflectors (AODs) is used to steer a pair of laser beams to address individual atoms of an array of atoms so that the beams can conditionally induce a 2-photon transition between the atom's quantum energy levels. The first beam is deflected into a +1 diffraction order, resulting in an AOD output beam with a frequency greater than that of the respective AOD input beam. The second beam is deflected into a −1 diffraction order so that the AOD output beam has a frequency less than that of the respective AOD input beam. The equal and opposite frequency changes compensate it other so that the sum of the output frequencies remains constant.

18 Claims, 5 Drawing Sheets

CONSTANT-FREQUENCY ACOUSTO-OPTIC BEAM STEERING

BACKGROUND

Whereas classical digital computers manipulate units, e.g., bits, of classical information, quantum computers manipulate units, e.g., qubits, of quantum information. Both classical bits and quantum qubits can be represented physically using two-state carriers. Examples of two-state quantum carriers include an electron that can transition between a spin up and a spin down state, and an electron in an atom that can transition between hyperfine ground states. A classical two-state carrier assumes one of the two states (e.g., respectively representing a logic-0 and a logic-1) at any given time; a quantum two-state carrier can be in a coherent superposition of both states simultaneously.

Qubits can be represented by a variety of quantum-state carriers, including superconducting circuits, color centers in a solid-state host (e.g., nitrogen-vacuum centers in diamond), quantum dots, neutral atoms, ions, and molecules. Ions and neutral atoms of a given isotope are, by their nature, all identical and, so, have an advantage over manufactured alternatives. However, while closely spaced ions generally interact with their neighbors due to Coulomb forces, interactions between closely packed neutral atoms can be switched on and off, e.g., by making them enter and exit Rydberg states. Accordingly, cold atoms provide a favorable technology for implementing dense qubit arrays.

The quantum states of atoms can be controlled by electromagnetic radiation (EMR), for example, near infrared and visible light. There is a challenge to directing the EMR to address an individual atom in an atom array. For example, EMR can be steered using microelectromechanical mirrors; however, the longevity of such mirrors can be limited given large number of movements per second over years of use. Accordingly, an alternative technology for steering laser beams is sought.

DETAILED DESCRIPTION

The present invention provides for acousto-optic steering of plural EMR (e.g., laser) beams for addressing quantum arrays such that changes in frequency as a function of target position offset one another so that a mix frequency of the beams remains resonant with a target transition. Additional aspects of the invention provide for a constant beam waist as target position changes, as well as the addressing of plural array sites in parallel. The invention is applicable to a variety of quantum technologies in which light is used to control and/or read out quantum arrays including those based on neutral atoms, Rydberg states of atoms, trapped ions, molecules, electrons, and quantum dots in semiconductor materials.

Acousto-optic deflectors (AODs) can steer laser beams in one or two dimensions to address individual quantum-state carriers (QSCs), e.g., atoms. However, AODs, also known as "acousto-optic modulators" (AOMs) modify frequency and amplitude along with beam direction. Control of QSCs is usually frequency dependent so the changes of frequency that accompany changes of direction are problematic. The present invention addresses such changes in frequency by using two-or-more-photon transitions such that a change in frequency in one beam as it changes direction is compensated for by a change or changes in one or more other frequencies to provide a constant sum, difference, or other mix frequency with which to control QSCs.

Figure 1:
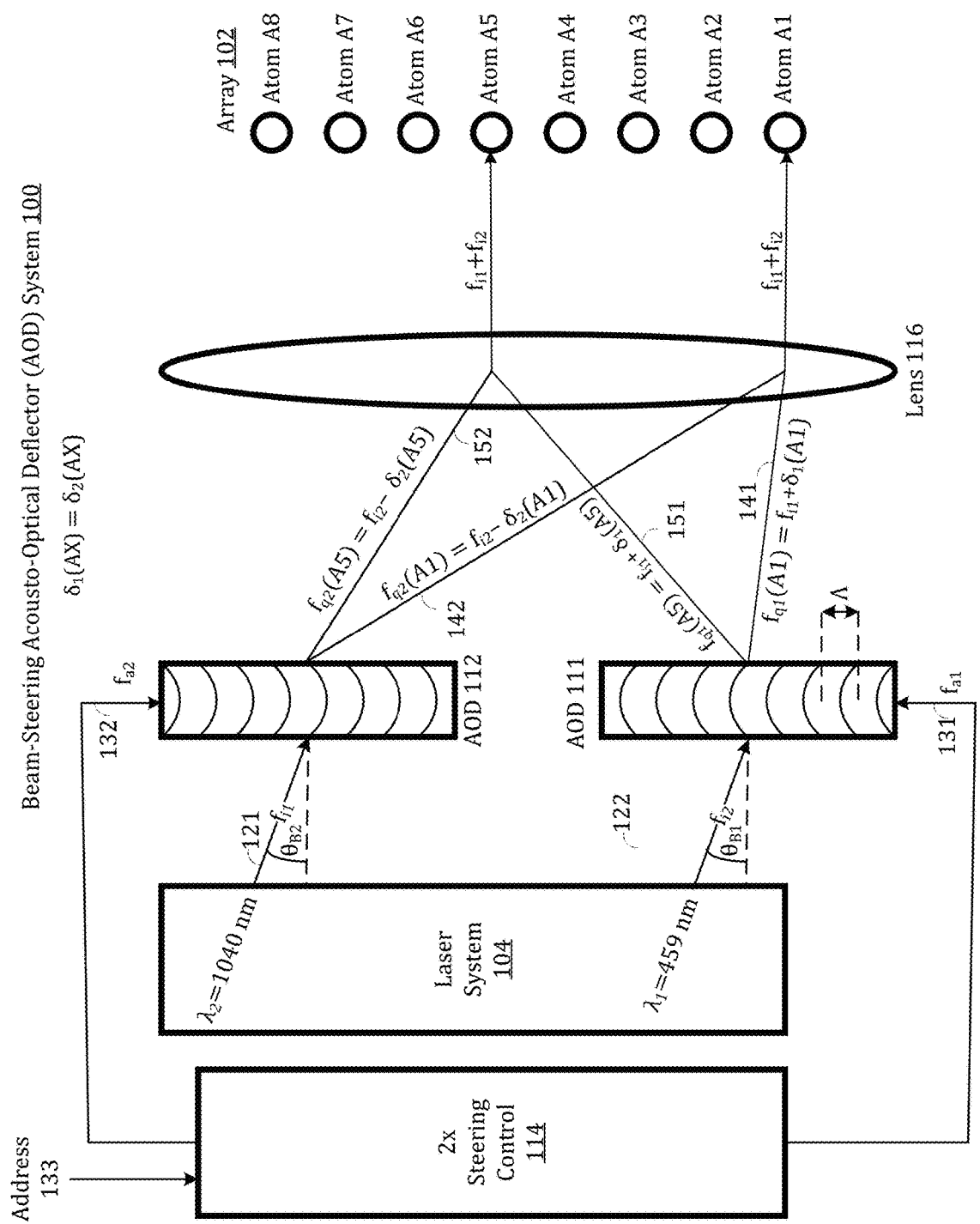
FIG. 1 is a schematic view of a beam steering acousto-optic deflector system for controlling energy levels of atoms in a quantum array.

For example, in beam-steering AOD system 100 of FIG. 1, two laser beams can change frequencies in opposite directions to provide a constant sum frequency. Beam-steering AOD system 100 is designed for controlling quantum states of rubidium 87 ($^{87}$Ru) atoms A1-A8 arranged in a linear array 102, e.g., to execute a quantum computer program, i.e., a quantum circuit. To this end, system 100 includes a laser system 104, AODs 111 and 112, a dual (aka, 2×) steering control 114, and a focusing lens 116.

In the illustrated scenario, laser system 104 is shown outputting AOD input laser beams 121 and 122. Blue beam 121 has a wavelength of 459 nanometers (nm) and a corresponding frequency of 653 terahertz (THz). Near infrared beam 122 has a wavelength of 1040 nm and a corresponding frequency of 288 THz. The total of the two frequencies is 941 THz, which is resonant with a transition from a $6s_{1/2}$ ground state of rubidium 87 to a $75s_{1/2}$ Rydberg state of rubidium 87. Thus, beams 121 and 122 are used together to induce this transition in a target $^{87}$Ru atom provided: 1) the atom is in the $6s_{1/2}$ ground state to begin with; and 2) the transition is not precluded by a Rydberg blockade, e.g., a nearby atom already occupying the $75s_{1/2}$ Rydberg state. Such a conditional transition is useful for executing a logic gate of a quantum circuit.

AODs 111 and 112 are used to deflect beams 121 and 122, respectively to a selected target atom. To this end, AODs 111 and 112 are arranged with respect to laser system 102 so that beams 121 and 122 are incident respective AODs 111 and 112 at Bragg angles $\theta_{B1}$ and $\theta_{B2}$, respectively. In the illustrated embodiment, $\theta_{B1}=\theta_{B2}$, since AODs 121 and 122 are nominally identical. In response to receiving an AOD input beam, an AOD outputs and AOD output beam with a direction that is different from, that is, deflected relative to, the AOD input beam. The amount of deflection is a function of the frequency of an acoustic signal propagating through the respective AOD 111, 112 and thus the frequency $f_{a1}$, $f_{a2}$ of the respective drive signal 131, 132 input to the respective AOD 111, 112.

During execution of a quantum circuit, an address 133 of a target atom is input to steering control 114, which sets the frequencies $f_{a1}$ and $f_{a2}$ of drive signals 131 and 132 respectively to achieve the desired deflections for the outputs of AODs 111 and 112. Thus, the deflections are a function of the addressed target atom. Thus, for AOD 111, the deflection represented by AOD output beam 151 when atom A5 is selected differs from the deflection represented by AOD output beam 141 when atom A1 is selected; likewise, for AOD 112, the deflection represented by AOD output beam 152 when atom A5 is selected differs from the deflection represented by AOD output beam 142 when atom A1 is selected. This ability to control AOD output beam deflection as a function of drive signal frequency that provides for address-specific beam steering.

As mentioned above, a characteristic of AODs is that changes in deflection are accompanied by changes in frequency. In the case of AOD 112, the direction of input beam 122 is generally the same (downward) as the direction of acoustic propagation due to drive signal 132 through AOD 112. In such a case, the frequency of the deflected output beam is greater than the frequency of the input beam. On the other hand, the generally downward direction of input beam 121 to AOD 111 opposes the upward direction of acoustic propagation due to drive signal 131 through AOD 111 so that the frequency of an AOD output beam is less than the frequency of the AOD input beam. If the amount of increase associated with AOD 112 matches the amount of decrease π for AOD 111, then the net change for the total frequency is zero. In the case of a net zero difference in the sum frequency, a mix of the resulting AOD output beams would still be able to cause the target two-photon transition of the target atom.

For example, when atom A1 is selected as the target atom to be addressed, AOD 111 outputs beam 141 with a frequency $f_{q1}(A1)$ and AOD 112 outputs beam 142 with frequency $f_{q2}(A1)$. In that case:

$$f_{q1}(A1) = f_{i1} + \delta_1(A1)$$
$$f_{q2}(A1) = f_{i2} - \delta_2(A1)$$

When $\delta_1(A1)=\delta_2(A1)$ then $f_{q1}(A1)+f_{q2}(A1)=f_{i1}+f_{i2}$ so the mix is resonant with the target transition of atom A1.
When atom A5, for example, is selected as the target atom, $\delta_1(A5) \neq \delta_1(A1)$ and $\delta_2(A5) \neq \delta_2(A1)$ but $$f_{q1}(A5) = f_{i1} + \delta_1(A5)$$
$$f_{q2}(A5) = f_{i2} - \delta_2(A5)$$

When $\delta_1(A5)=\delta_2(A5)$ then $f_{q1}(A5)+f_{q2}(A5)=f_{i1}+f_{i2}$ so the mix is resonant with the target transition of atom A1 (from the $6s_{1/2}$ ground state of rubidium 87 to the $75s_{1/2}$ Rydberg state of rubidium 87). the total frequency at the target atom is the same as the total of the laser output frequencies regardless of which atom of the array is selected as the target Since resonance has some frequency tolerance, resonance can be achieved when $\delta_1(AX) \cong \delta_2(AX)$, where X is an atom index that can assume integer values from 1 to 8. In an alternative environment, the sum of the AOD output frequencies is different from the sum of the AOD input frequencies.

Figure 2:
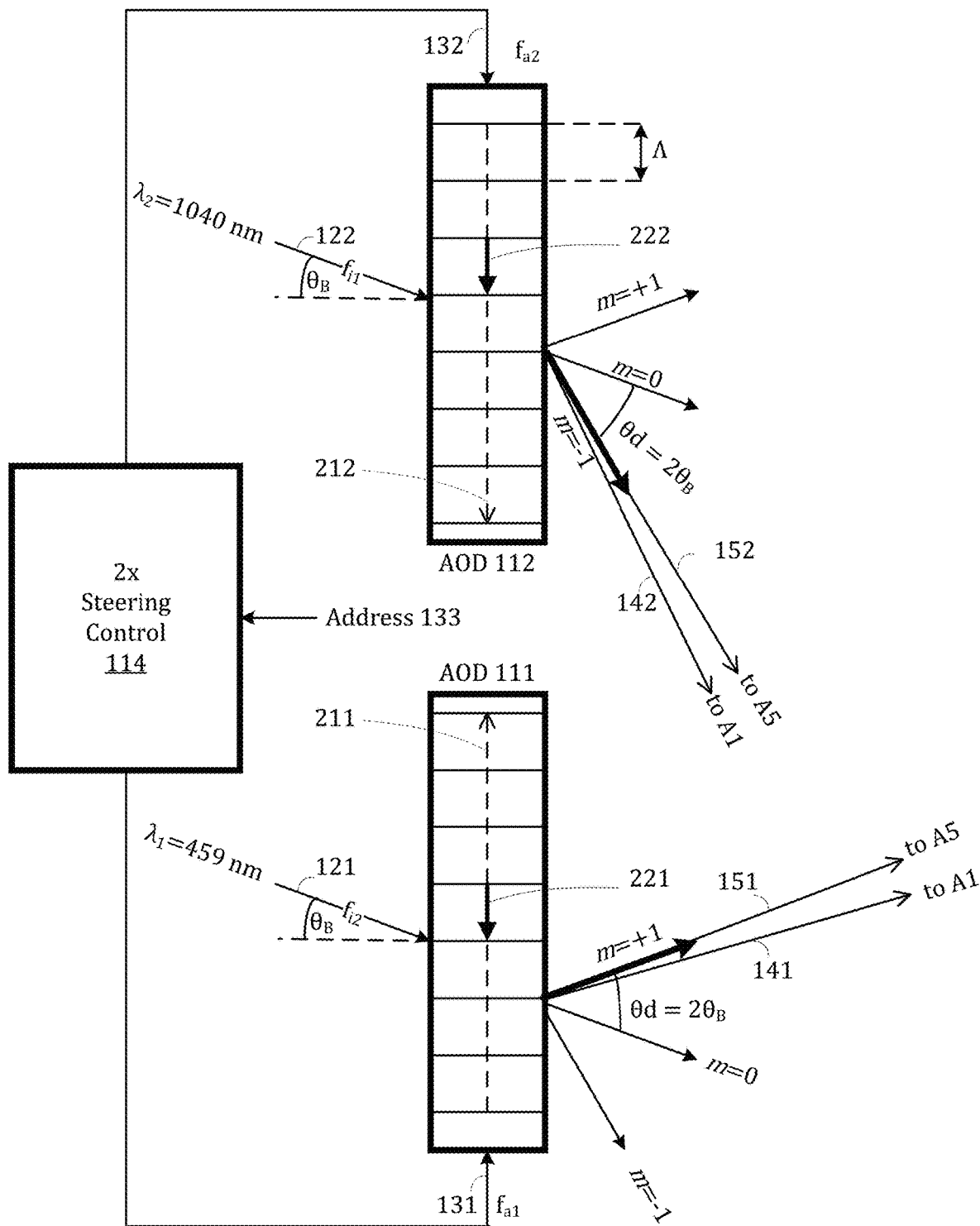
FIG. 2 depicts diffraction orders of acousto-optic deflectors (AODs) of the system of FIG. 1.

AODs 111 and 112 deflect input beams that come in at a Bragg angle into a range of diffraction orders, including, as shown in FIG. 2, diffraction orders m=+1, m=0, and m=1. How energy is distributed among these orders depends in part on the relationship between the directions of the acoustic waves and the optical inputs. For AOD 111, the direction of acoustic propagation 211 is upward in FIG. 2, while the projection 221 of optical input beam 121 onto the acoustic propagation path is downward. In other words, input beam 121 propagates "against" the direction 211 of acoustic propagation. In this case, most of the energy of input beam 121 is distributed to diffraction order m=+1. The direction of acoustic propagation 212 for AOD 112 is downward in FIG. 1, while the projection 222 of input beam 122 onto the acoustic propagation path 212 is also downward. In other words, the optical input beam is "along" the direction of acoustic propagation 222. In this case, energy of input beam 122 is distributed primarily to the m=−1 diffraction order.

The basic principle on which an AOD operates involves diffraction of a beam from a piece of transparent material which supports propagation of an acoustic wave. An electrical transducer is attached to the material and application of an electrical signal at frequency $f_a$ generates an acoustic wave with angular frequency $\Omega=2\pi f_a$ propagating at the acoustic velocity $v_a$. The wavelength of the acoustic wave is $$\Lambda = v_a / f_a$$

and the wavenumber is $$K = 2\pi/\Lambda = \Omega/v_a.$$

The acoustic wave results in periodic variation of the strain inside the optical material. The dielectric constant changes proportional to the applied strain in materials that exhibit a photo-elastic effect. The tensorial nature of photoelasticity is complicated. For present purposes, a local scalar response can be assumed such that the refractive index change is $\delta n=pA_a$ where $A_a$ is the amplitude of the acoustic wave and p is proportional to the relevant component of the photo-elastic tensor.

Consider a device with acoustic wave velocity $v_a$ at an applied frequency $f_a$ as shown in FIG. 1. Light of angular frequency w and wavelength $$\lambda = 2\pi c/\omega$$

is diffracted by the wave through an angle $\theta_d=2\theta_B$. At the Bragg angle $\theta_B$, the light reflected from multiple planes interferes constructively giving a strong diffracted intensity. The condition for this to occur is 2hkn=m2π, where $$k = 2\pi/\lambda,$$

n is the refractive index inside the medium and the integer m specifies the diffraction order. Substituting $h=\Lambda \sin(\theta_B)$ yields the condition $$\sin(\theta_B) = m\frac{\pi}{nk\Lambda} = m\frac{\lambda/n}{2\Lambda} = m\frac{\lambda/n}{2}\frac{f_a}{v_a}$$

The deflection angle inside the AOD is $$\theta_d = 2\theta_B = 2\sin^{-1}\left(m\frac{\lambda/n}{2}\frac{f_a}{v_a}\right) \approx m(\lambda/n)\frac{f_a}{v_a}$$

Outside the AOD, the angle is increased by a factor of n so using the approximation that sin $(\theta_d) \cong \theta_d$ yields $$\theta_d \simeq m\lambda \frac{f_a}{v_a}$$

Thus, the AOD can be used as a beam scanner giving parallel displacements by placing the device in the front focal plane of lens 116.

The deflected light is frequency shifted by an amount which can be calculated from energy conservation. The acoustic phonons have energy $E=\hbar\Omega$ and momentum $$\hbar K = \hbar\Omega/v_a.$$

Energy and momentum conservation dictate that the light diffracted into order m satisfies $$\omega_d = \omega + m\Omega, k_d = k + m.$$

where k is the angular wavenumber, i.e., the number of radians per unit distance.

Thus, the angular deflection is accompanied by a change in frequency. For applications to control an array of QSCs representing qubits, the angle dependent frequency shift must be compensated for in order to maintain a desired resonance condition at multiple sites in the qubit array. In many qubit control applications, the sum or difference of two frequencies each corresponding to a distinct laser is employed. Herein, the frequency dependence of one laser is compensated by an opposing frequency difference associated with another laser so as to maintain a constant frequency sum or difference independent of the deflection angle and independent of the position of the addressed qubit. Since the optical frequency varies with the scan angle, resonance cannot simultaneously be achieved at multiple locations with a single laser frequency. This limitation can be overcome by using a two-photon transition with the frequency shifts of the photons arranged to cancel each other.

Figure 3:
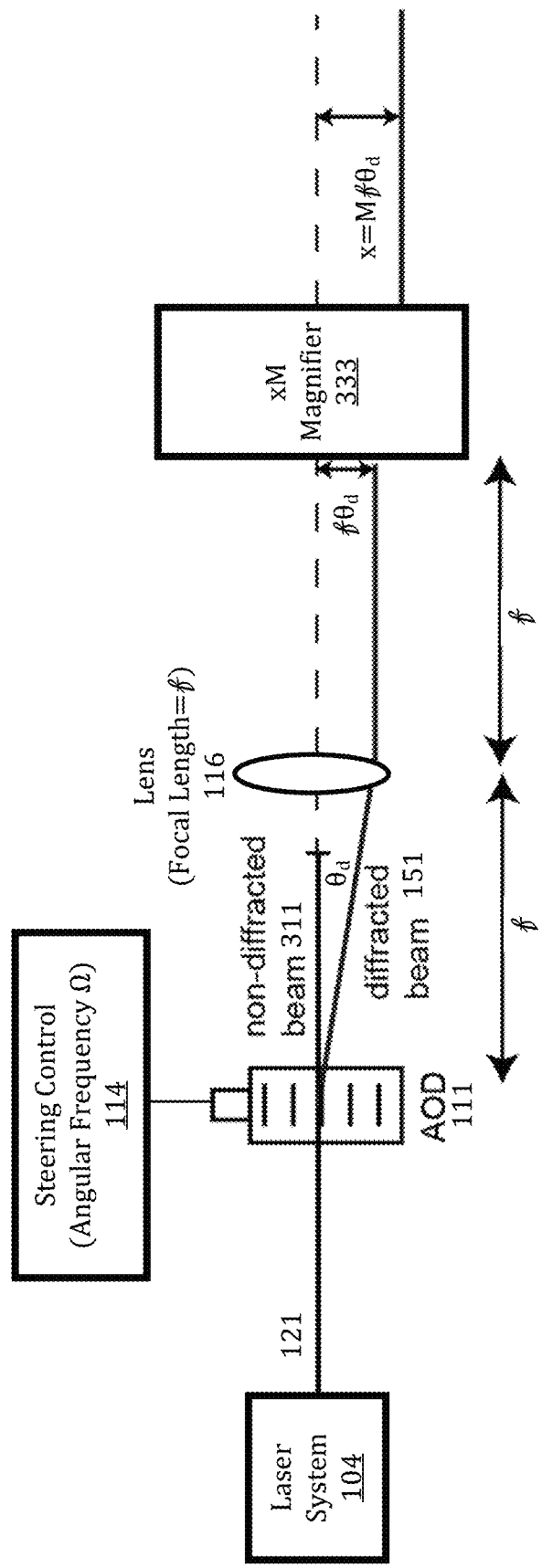
FIG. 3 shows a path for a diffracted beam produced by an AOD of the system of FIG. 1.

As shown in FIG. 3, AOD 111 diffracts beam 151 by an angle $\theta_d$ relative to a non-diffracted beam 311. Lens 116 has focal length $f$ and is separated from AOD 112 and from a magnifier 333 with magnification M by a distance $f$. As a result, diffracted beam 151 is separated from non-diffracted beam by $f\theta_d$ prior to magnification and by $Mf\theta_d$ post magnification.

Lens 116 is separated from AODs 111 and 112 (FIG. 1) by a distance $f$ and from an imaging magnification $M_j$ for each beam, where j is a beam index that can assume values 1 and 2. The beam position in the output plane using diffraction order $m_j$ is $$x_j \simeq f\theta_d \simeq m_j \frac{\lambda_j f \cdot f_{aj}}{n_j v_a} M_j, j = 1, 2$$

where the acoustic velocity is $v_a$, the applied frequency is $f_{aj}$, $n_j$ is the index of refraction of the modulator, and $\lambda_j$ is the vacuum wavelength of beam j. Inverting yields $$f_{aj} \simeq \frac{n_j v_a}{m_j \lambda_j M_j f} x_j$$

Putting $x_1 = x_2 = x$ and imposing the resonance condition $f_{a1} + f_{a2} = 0$ yields $$\frac{n_1}{m_1 M_1 \lambda_1} + \frac{n_2}{m_2 M_2 \lambda_2} = 0$$

Choosing diffraction orders $m_1 = 1$ and $m_2 = -1$ ml this relation can be satisfied using $$\frac{M_2}{M_1} = \frac{\lambda_1 n_2}{\lambda_2 n_1}$$

Satisfying this relation realizes a constant sum frequency independent of the selected QSC.

It can be desirable to meet an additional constraint that the beam waist (cross section) $w_j^{out}$ be constant over the qubit array. Given a beam waist $w_j$ at the respective AOD, the beam waist at the array is given by $$w_j^{out} = M_j \frac{\lambda_j f}{\pi w_j}$$

Setting $w_1^{out} = w_2^{out}$ gives the condition $$\frac{w_2}{w_1} = \frac{\lambda_2 M_2}{\lambda_1 M_1}$$

Combining this equation with the previously derived equation $$\frac{M_2}{M_1} = \frac{\lambda_1 n_2}{\lambda_2 n_1}$$

yields $$\frac{w_2}{w_1} = \frac{n_2}{n_1}$$

As an example, using $\lambda_1 = 1038$ nm and $\lambda_2 = 459$ nm (wavelengths used for excitation of Cesium atoms to Rydberg states), $$\frac{M_2}{M_1} = 0.442$$

and $$w_2 = w_1$$

so that the beam waists at the qubit array are equal.

Figure 4:
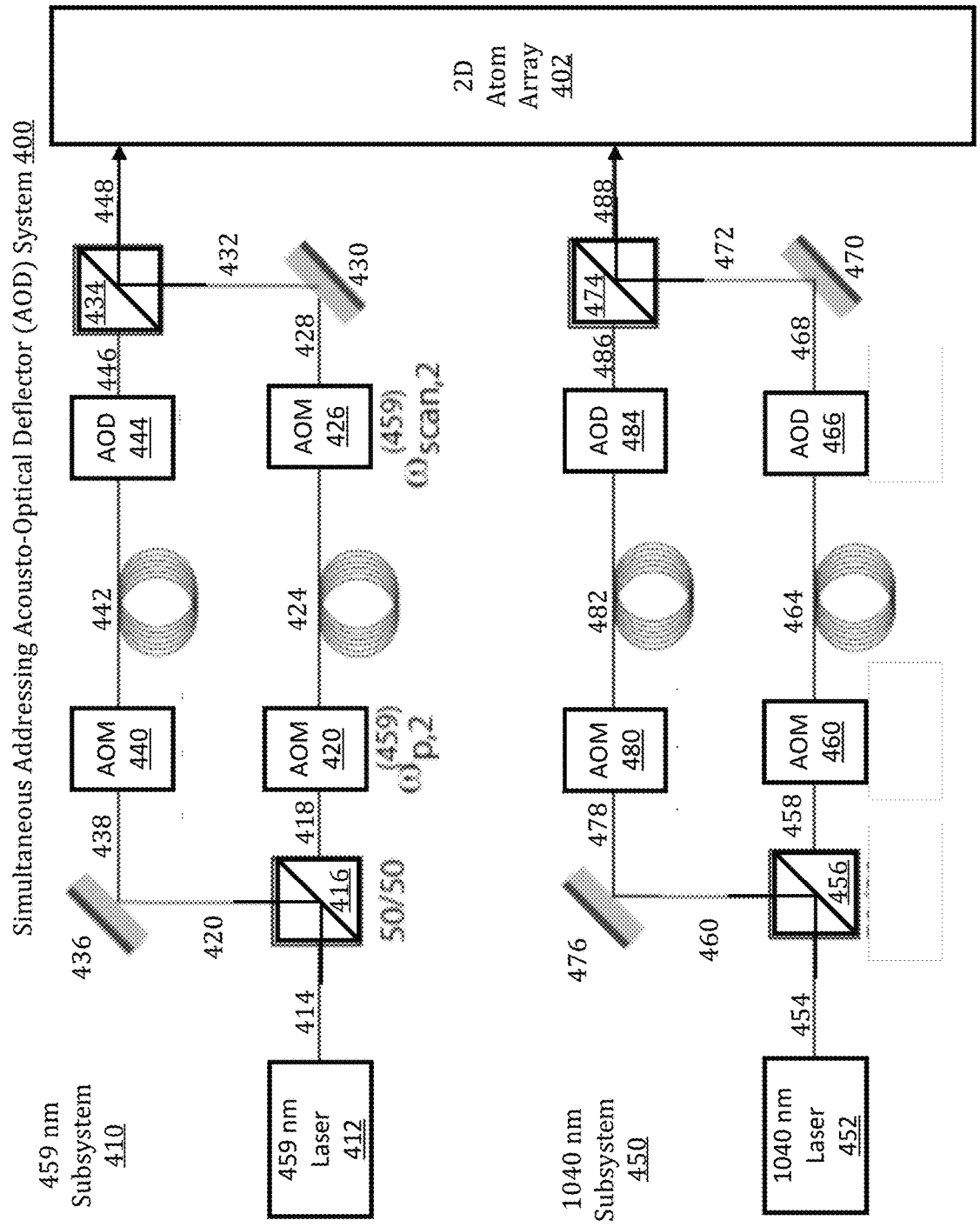
FIG. 4 is a schematic illustration of an AOD system that can address atoms of a two-dimensional array simultaneously.

A simultaneous addressing AOD system 400, shown in FIG. 4, includes a 459 nm subsystem 410 and a 1040 nm subsystem 450. 459 nm subsystem 410 includes a 459 nm laser source 412 that outputs a 459 nm beam 414. A 50/50 beam splitter 416 divides beam 414 into a lower branch 418 and an upper branch 420, with each branch independently targeting a respective atom of a two-dimensional atom array 402. Branch 418 feeds a pulse-shaping AOM 422, the output of which is guided by optical fiber 424. Optical fiber 424 feeds a two-dimensional AOD 426, which yields a deflected output 428. Output 428 is reflected by a mirror 430 along a path 432 to a 50/50 beam splitter 434 which merges the outputs of branches 418 and 420.

1040 nm subsystem 450 includes a 1040 nm laser source 452 that outputs a 1040 nm beam 454. A 50/50 beam splitter 456 divides beam 454 into a lower branch 458 and an upper branch 460, with each branch independently targeting a respective atom of a two-dimensional atom array 402. Branch 458 feeds a pulse-shaping AOM 460, the output of which is guided by optical fiber 464. Optical fiber 464 feeds a two-dimensional AOD 466, which yields a deflected output 468. Output 468 is reflected by a mirror 470 along a path 472 to 50/50 beam splitter 434 which merges the outputs of branches 418 and 420 to yield subsystem output 488. Note that subsystem outputs 448 and 488 include simultaneous pairs of beams directed at pairs of atoms.

Simultaneous addressing as described above in the example of 459 and 1040 nm wavelengths uses acoustic frequencies $\omega_1^{459}$, $\omega_1^{1040}$ at a first qubit site and $\omega_2^{459}$, $\omega_2^{1040}$ at a second qubit site. The frequencies are related by $\omega_2^{459} = \omega_1^{459} + \delta$ and $\omega_2^{1040} = \omega_1^{1040} - \delta$ !(459) which ensures that $\omega_1^{459} + \omega_1^{1040} = \omega_2^{459} + \omega_2^{1040}$ so both sites are driven by the same sum frequency.

Simultaneous two-site addressing can be achieved with $\delta = 0$, which is desirable to mitigate errors arising from unwanted optical scattering by using two 2D scanners for each laser. The optical layout is shown in FIG. 2. The resonance conditions at the first and second sites are $$\omega_{459} + \omega_{p.1}^{(459)} + \omega_{scan.1}^{(459)} + \omega_{1040} + \omega_{p.1}^{(1040)} + \omega_{scan.1}^{(1040)} = \omega_{Sum}$$

$$\omega_{459} + \omega_{p.2}^{(459)} + \omega_{scan.2}^{(459)} + \omega_{1040} + \omega_{p.2}^{(1040)} + \omega_{scan.2}^{(1040)} = \omega_{Sum}$$

with $\omega_{Sum}$ the transition excitation frequency. Suppressing the crosstalk sensitivity that arises when the 459 and 1040 light frequencies are different at the two sites can be achieved when $$\omega_{p.1}^{(459)} + \omega_{scan.1}^{(459)} = \omega_{p.2}^{(459)} + \omega_{scan.2}^{(459)}$$

$$\omega_{p.1}^{(1040)} + \omega_{scan.1}^{(1040)} = \omega_{p.2}^{(1040)} + \omega_{scan.2}^{(1040)}$$

and the source frequencies $\omega_{459}$ and $\omega_{1040}$ set to satisfy the resonance conditions. When the first and second sites are geometrically near to each other, the scan frequencies are similar; this implies that the pulse carrier frequencies only need a moderate adjustment range. This optical configuration enables addressing two sites concurrently. To enable addressing of three or more sites concurrently, additional modulators can be added, and all beams can be combined at beam splitters.

Figure 5:
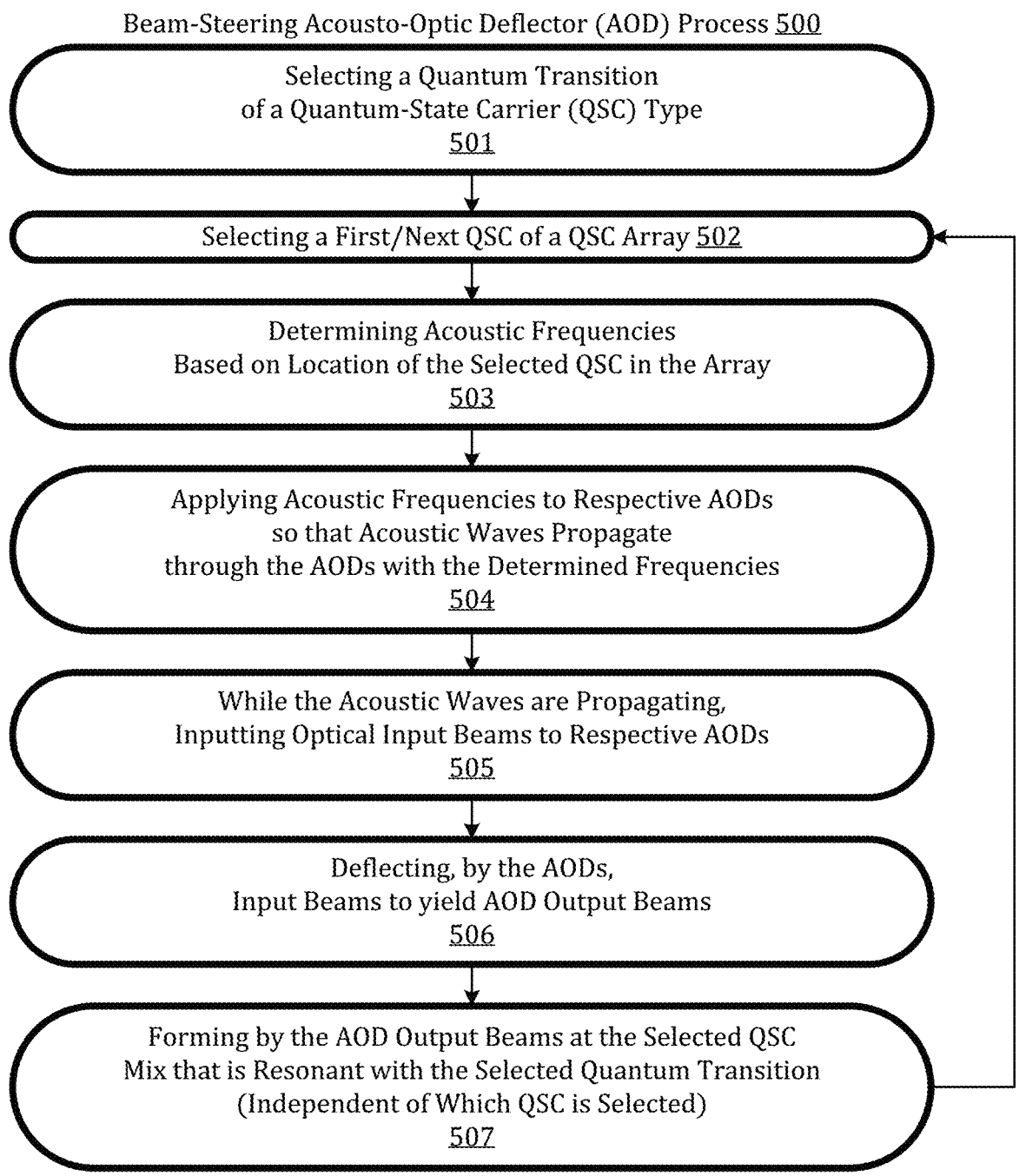
FIG. 5 is a flow chart of a beam-steering AOD process implementable in the systems of FIGS. 1 and 4 and in other systems.

A beam-steering acousto-optic deflector (AOD) process 500 is flow charted in FIG. 5. At 501, a target quantum transition of a selected quantum-state carrier type is selected. In a first iteration of 502, a first QSC of a QSC array is selected. At 503, acoustic frequencies are determined based on an array location (aka address) of the selected QSC. At 504, the determined acoustic frequencies are applied to respective AODs so that acoustic waves propagate through the respective AODs with the determined frequencies.

At 505, while the acoustic waves are propagating, optical input beams are input to respective AODs. At 506, the optical input beams are deflected by respective AODs to yield AOD output beams. At 507, the AOD output beams form a mix at the selected QSC, the mix being resonant with the selected target transition. Actions 502-507 can be iterated with different QSCs of the array be selected for respective iterations with resulting mixes being resonant with the target transition regardless of which QSCs of the array are selected.

System 100 (FIG. 1) uses two excitation beams 121 and 122 for a 2-photon transition with different wavelengths/frequencies. Other embodiments achieve monochromatic 2-photon transitions using two excitation beams with the same wavelengths/frequencies. For example, two 778 nm excitation beams can be used for a 2-photon transition from a $5\,^2S_{1/2}$ ground state to a $5D_{5/2}$ excited state in rubidium 87.

In system 100, a 2-photon transition is used to achieve 3-wave mixing at a target QSC. Other embodiments employ n-photon transitions to achieve n+1-wave mixing, where n>2 is a positive integer. In such embodiments a mix frequency can result which is a sum of three frequency or another combination of pluses and minuses. For example, the mix can be of the form $f_1+f_2+f_3$, $f_1+f_2-f_3$, or $f_1-(f_2+f_3)$.

Herein, a "system" is a group of interacting or interrelated elements that act according to a set of rules to form a unified whole. A "process" is a system in which the elements are actions. "Quantum" is an adjective characterizing a system as exhibiting or using quantum-mechanical phenomena such as eigenstates (solutions to Schrodinger's time dependent or time independent Wave Equation), superposition, and entanglement. Quantum states are eigenstates and superpositions of eigenstates. Herein, a "quantum state carrier" (QSC) is any physical system that can assume alternative eigenstates and superpositions of those eigenstates. Examples of QSCs include superconducting circuits, quantum dots in semiconductor hosts, color centers in a solid-state host (e.g., nitrogen-vacuum centers in diamond, and neutral and charged atoms and molecules.

Herein, art labelled "prior art, if any, is admitted prior art; art not labelled "prior art", if any, is not admitted prior art. The illustrated embodiments, variations thereupon and modifications thereto are provided for by the present invention, the scope of which is defined by the accompanying claims.

What is claimed is:

1. A beam-steering acousto-optic deflector (AOD) process comprising:
    deflecting, using an AOD set of one or AODs, plural EMR beams so that they are incident a first quantum state carrier (QSC) occupying a first site of an array of QSCs, the deflector set being driven by a respective drive set of one or more drive signals, each of the drive signals having a respective first drive frequency, each of the plural EMR beams having a respective input frequency as it is input to the deflector set and an output frequency as it is output from the deflector set, the plural EMR beams being collectively characterized by a first mix frequency that is resonant with a first transition of the first QSC, the plural EMR beams including,
        a first EMR beam with a first input frequency and a first output frequency, the output frequency being greater than the input frequency, and
        a second EMR beam with a second input frequency and a second output frequency, the second output frequency being less than the second input frequency;
    changing the drive frequencies so that the deflector set is driven by a drive set of one or more drive signals having respective second drive frequencies so that the EMR Beams are redirected so that they are incident a second QSC occupying a second site of the array of QSCs and so that the EMR beams are collectively characterized by a second mix frequency, the second mix frequency that is resonant with the first transition of the first QSC, the first EMR beam with a first input frequency and a third output frequency, the third output frequency being different from the first output frequency, and a second EMR beam with a second input frequency and a fourth output frequency, the fourth output frequency being different from the second output frequency.

2. The beam-steering process of claim 1 wherein EMR incident the first QSC includes light of the first EMR beam diffracted into a +1 diffraction order and light of the second EMR beam diffracted into a −1 diffraction order.

3. The beam-steering process of claim 1 wherein the drive frequency for an AOD to which the first EMR beam is input is equal to the drive frequency for that AOD or another AOD into which the second EMR beam is input.

4. The beam-steering process of claim 1 wherein the QSCs are atoms, and the transition is from a ground state to a Rydberg state.

5. The beam steering process of claim 4 wherein the ground state is a $6s_{1/2}$ ground state of rubidium 87 and the Rydberg state is a $75s_{1/2}$ Rydberg state of rubidium 87.

6. The beam-steering process of claim 1 wherein the first mix frequency equals the second mix frequency.

7. The beam steering process of claim 6 wherein the first mix frequency is the sum of the first output frequency and the second output frequency, and the second mix frequency is the sum of the third output frequency and the fourth output frequency.

8. A beam-steering acousto-optic deflector (AOD) system comprising:

a laser system for producing plural concurrent laser beams with respective input frequencies, the laser beams including a first laser beam with a first input frequency and a second laser beam with a second input frequency;

a drive signal generator for generating a drive set of one or more drive signals having respective drive frequencies;

an AOD set of one or more AODs, each AOD of the AOD set being coupled to the drive signal generator for receiving a respective drive signal therefrom, each AOD of the AOD set being optically coupled to the laser system for receiving a respective laser beam therefrom, each AOD of the AOD set converting a received laser beam to an AOD output beam having a respective output frequency and a respective diffraction order, the AOD set being coupled to an array of quantum state carriers (QSCs) for providing plural AOD output beams to a QSC selected from the QSCs of a QSC array based on the frequencies of the drive set such that the provided AOD output beams results in a mix frequency that is resonant with a quantum-state transition of the selected QSC regardless of which QSC is selected, the AOD set converting the first laser beam to a first AOD output beam a first AOD output frequency greater than the first input frequency, the AOD set converting the second laser beam to a second AOD output beam having a second AOD output frequency less than the second input frequency.

9. The beam-steering AOD system of claim 8, wherein the first AOD output beam includes light of the first laser beam diffracted into a +1 diffraction order and light of the second laser beam diffracted into a −1 diffraction order.

10. The beam-steering AOD system of claim 8 wherein the drive frequency for an AOD to which the first laser beam is input is equal to the drive frequency for that AOD or another AOD into which the second laser beam is input.

11. The beam-steering AOD system of claim 8 wherein the QSCs are atoms, and the transition is from a ground state to a Rydberg state.

12. The beam steering AOD system of claim 11 wherein the ground state is a $6s_{1/2}$ ground state of rubidium 87 and the Rydberg state is a $75s_{1/2}$ Rydberg state of rubidium 87.

13. The beam-steering AOD system of claim 8 wherein mix frequency is the sum of the AOD output frequencies.

14. A beam-steering acousto-optic deflector (AOD) process comprising:

a) specifying an array location of quantum-state carrier (QSC) located in an array of QDCs, the QSCs being characterized by a target QSC transition;

b) determining acoustic frequencies for respective AODs based on the specified array location;

c) applying the determined acoustic frequencies to the respective AODs so that acoustic waves propagate through the respective AODs;

d) transmitting AOD input beams so that they are incident respective AODs at Bragg angles; and e) deflecting, using respective AODs, AOD input beams to yield AOD output beams that illuminate the OSC at the specified location with a mix that is resonant with the target QSC transition.

15. The beam-steering AOD process of claim 14 wherein actions a-e are iterated with different array locations such that a mix frequency of the mix is independent of which QSC location is selected.

16. The beam-steering AOD process of claim 14 wherein:

a first of the AOD output beams that illuminates the target OSC has a higher frequency that its respective AOD input beam; and a second of the AOD output beams that illuminates the target OSC has a lower frequency that its respective AOD input beam.

17. The beam-steering AOD process of claim 14 wherein a first AOD input beam is along a direction of propagation for its respective AOD and a second AOD input beam opposes a direction of propagation for its respective AOD.

18. The beam-steering AOD process of claim 14 wherein:

a first of the AOD output beams that illuminates the target OSC is a diffraction of order +1 of its respective AOD input beam; and a second of the AOD output beams that illuminates the target OSC is a diffraction of order 11 of its respective AOD input beam.

* * * * *

UNITED STATES PATENT AND TRADEMARK OFFICE
CERTIFICATE OF CORRECTION

PATENT NO. : 11,531,249 B1
APPLICATION NO. : 17/727756
DATED : December 20, 2022
INVENTOR(S) : Mark Saffman It is certified that error appears in the above-identified patent and that said Letters Patent is hereby corrected as shown below:

In the Claims

In Column 8, Line(s) 43, Claim 1, after "one or", insert --more--.
In Column 9, Line(s) 11, Claim 2, after "claim 1", insert --,--.
In Column 9, Line(s) 15, Claim 3, after "claim 1", insert --,--.
In Column 9, Line(s) 19, Claim 4, after "claim 1", insert --,--.
In Column 9, Line(s) 22, Claim 5, after "claim 4", insert --,--.
In Column 9, Line(s) 25, Claim 6, after "claim 1", insert --,--.
In Column 9, Line(s) 27, Claim 7, after "claim 6", insert --,--.
In Column 10, Line(s) 8, Claim 10, after "claim 8", insert --,--.
In Column 10, Line(s) 12, Claim 11, after "claim 8", insert --,--.
In Column 10, Line(s) 15, Claim 12, after "claim 11", insert --,--.
In Column 10, Line(s) 18, Claim 13, after "claim 8", insert --,--.
In Column 10, Line(s) 36, Claim 15, after "claim 14", insert --,--.
In Column 10, Line(s) 40, Claim 16, after "claim 14", insert --,--.
In Column 10, Line(s) 47, Claim 17, after "claim 14", insert --,--.
In Column 10, Line(s) 51, Claim 18, after "claim 14", insert --,--.

Signed and Sealed this
Fifth Day of September, 2023

Katherine Kelly Vidal
*Director of the United States Patent and Trademark Office*